(12) United States Patent
Romanov et al.

(10) Patent No.: US 12,736,991 B2
(45) Date of Patent: Sep. 15, 2026

(54) CONTROLLER FOR AN ELECTRONICALLY CONTROLLED RESISTOR

(71) Applicant: CLOSED-UP JOINT-STOCK COMPANY DRIVE, Novosibirsk (RU)

(72) Inventors: Yuriy I. Romanov, Novosibirsk (RU); Sergey M. Kozhevnikov, Novosibirsk (RU)

(73) Assignee: Drive CJSC, Novosibirsk (RU)

( * ) Notice: Subject to any disclaimer, the term of this patent is extended or adjusted under 35 U.S.C. 154(b) by 458 days.

(21) Appl. No.: 18/562,278

(22) PCT Filed: May 17, 2021

(86) PCT No.: PCT/RU2021/000199

§ 371 (c)(1),
(2) Date: Nov. 17, 2023

(87) PCT Pub. No.: WO2022/245233

PCT Pub. Date: Nov. 24, 2022

(65) Prior Publication Data

US 2025/0093898 A1 Mar. 20, 2025

(51) Int. Cl.
*H03M 1/78* (2006.01)
*G05F 1/56* (2006.01)
*H03H 11/46* (2006.01)

(52) U.S. Cl.
CPC ............. *G05F 1/561* (2013.01); *H03H 11/53* (2013.01)

(58) Field of Classification Search
CPC ................................ G06F 1/561; H03H 11/53
USPC .................................................. 341/132–142
See application file for complete search history.

(56) References Cited

U.S. PATENT DOCUMENTS

2007/0194813 A1* 8/2007 Washburn .............. H03H 11/53 327/100
2012/0223782 A1* 9/2012 Hirama ................ H03B 5/1237 331/108 R
2018/0102800 A1* 4/2018 Engelhardt .......... H04B 1/0475

* cited by examiner

*Primary Examiner* — Peguy Jean Pierre
(74) *Attorney, Agent, or Firm* — Patentagar PLLC; Alexander Rabinovich

(57) ABSTRACT

A controller for an electronically controlled resistor, comprising a controllable current generator that outputs an output current; an amplifier receiving an input voltage proportional to the output current, and outputting an amplified input voltage to a first input of an adder; a voltage divider connected between a high-potential terminal and a low-potential terminal of the electronically controlled resistor; a buffer stage receiving an output of an external sense resistor, and outputting a buffered voltage to a controllable current generator to control the output current and to a second input of the adder, wherein the adder outputs a summed voltage; and an operational amplifier receiving the divided voltage and the summed voltage and outputting a control voltage to an external active element, wherein the active element and the sense resistor are connected in series between the high-potential terminal and the low-potential terminal of the electronically controlled resistor.

7 Claims, 4 Drawing Sheets

CONTROLLER FOR AN ELECTRONICALLY CONTROLLED RESISTOR

BACKGROUND OF THE INVENTION

Field of the Invention

The present invention relates to the field of electrical engineering and electronics, particularly, to measuring equipment, power electronics, radio engineering and communications, and consumer electronics. More particularly, the invention relates to controlling changes in resistance of a circuit portion by electronic means.

Description of the Related Art

The problem of changing resistance of a circuit portion within a broad range by electronic means is of high priority in many electronic applications. A solution to this problem will open new possibilities to create automated electrical, radio, etc. devices for various applications, including the Internet of Things (IoT).

A controller for an electronically controlled resistor (ECR) generates a control voltage, which changes resistance of an active element in the ECR within a broad range, depending on the amount of the input action.

Said ECR generally comprises an active element, a measuring (sense) resistor, and a controller for the ECR. The input action involves changing resistance of a variable control resistor, e.g., a mechanical potentiometer, a photoresistor, a thermistor, a digital potentiometer, etc., which is not a part of an ECR.A number of solutions are known in the art. For example, patents RU2666786, RU 2661348, RU 2658681, U.S. Pat. No. 10,447,167, I670920 (TW), I674742 (TW), and KR10-2054359 disclose a controller for the active element of an ECR, having the following characteristic features (see FIG. 1 of any of these publications, showing a conventional controller):

- a first terminal of the controller used to connect it to a control voltage source;
- a second terminal of the controller used to connect it to a low-potential terminal of the ECR;
- a third terminal of the controller which serves as its output and is used to connect it to the control terminal of the active element, which is a part of the ECR.

The conventional controller further comprises an operational amplifier, a reference resistor, a feedback resistor, and a constant voltage source, the noninverting input of the operational amplifier being connected to the first terminal of the reference resistor, and the second terminal of the reference resistor being connected to the first terminal of the controller.

The noninverting input of the operational amplifier is also connected to the first terminal of the feedback resistor, and the second terminal of the feedback resistor is connected to the operational amplifier output, which, in turn, is connected to the third terminal of the controller; and the inverting input of the operational amplifier is connected to the positive pole of the constant voltage source.

This conventional solution has the following drawbacks:

- insufficient precision of controlling resistance of a circuit portion, especially under destabilizing factors, such as ambient temperature;
- inability to use variable resistors (a photoresistor, a thermistor, a digital potentiometer, etc.) to control the resistance of a circuit portion.

Another conventional solution is disclosed in SU1807554, dated Apr. 7, 1993. The conventional controller of resistance of a circuit portion comprises (see FIG. 2,3 of the publication):

- a first terminal of the controller used to connect the controller to a high-potential terminal of the ECR;
- a second terminal of the controller which serves as its output and is used to connect the controller to the first terminal of the sense resistor, which is a part of the ECR;
- a third terminal of the controller used to connect the controller to the control action source acting as a variable analog voltage;
- a fourth terminal of the controller used to connect same to a low-potential terminal of the ECR.

The conventional solution further comprises:

- a control action conversion circuit,
- an operational amplifier,
- a feedback resistor,
- a limiting resistor, and
- a constant voltage source.

The noninverting input of the operational amplifier is connected to the first terminal of the limiting resistor, and the second terminal of the limiting resistor is connected to the fourth terminal of the controller.

The inverting input of the operational amplifier is connected to the output of the control action conversion circuit and to the first terminal of the feedback resistor, and the second terminal of the feedback resistor is connected to the operational amplifier output and to the second terminal of the controller.

The first input of the control action conversion circuit is connected to the first terminal of the controller, its second input is connected to the third terminal of the controller, and its third input is connected to the positive pole of the constant voltage source.

The output of the operational amplifier is connected to the second terminal of the controller.

This conventional solution has the following drawbacks:

- lack of control over the active element of the ECR;
- inability to use variable resistors (a photoresistor, a thermistor, a digital potentiometer, etc.) for control;
- there is an inverse relation between the resistance of the ECR and the control action represented by a changing analog voltage; and
- inability to obtain a low enough resistance of the ECR, which is often practically required.

The last drawback is caused by the fact that, in the conventional solution, the current flowing through the sense resistor takes path through the limiting resistor and sense resistor that are connected in series, and closes on the common wire. Therefore, there exists dependency between the resistance of the ECR and the resistances of the limiting resistor and the sense resistor. This dependency can only be neglected if the resistance of the sense resistor is many times higher than the aggregate resistance of the limiting resistor and the sense resistor, which causes the drawback described above.

Yet another conventional controller of resistance of a circuit portion is disclosed in U.S. Pat. No. 4,833,472, dated May 23, 1989. This conventional solution comprises (see FIG. 1 of the publication):

- a first terminal of the controller used to connect the controller to a high-potential terminal of the ECR;
- a second terminal of the controller used to connect the controller to the first terminal of the sense resistor, which is a part of the ECR;

a third terminal (group of terminals) of the controller used to connect the controller to a control digital code source;

a fourth terminal of the controller which is used to connect the controller to a low-potential terminal of the ECR;

a fifth terminal of the controller which serves as its output and is used to connect the controller to the control input of the active element, which is a part of the ECR.

The conventional controller further comprises an operational amplifier, a multiplier, and a digital-to-analog converter, the noninverting input of the operational amplifier is connected to the first terminal of the controller;

the inverting input of the operational amplifier is connected to the digital-to-analog converter output, while its inputs are connected to multiplier outputs, and the operational amplifier output is connected to the fifth terminal of the controller; and the third terminal (group of terminals) of the controller is connected to the first input (group of inputs) of the multiplier, and the second multiplier input is connected to the second terminal of the controller.

The main drawback of this conventional solution is that it does not allow to use variable resistors (a photoresistor, a thermistor, a digital potentiometer, etc.) for control.

Yet another conventional controller of resistance of a circuit portion is disclosed in JPS5111404, dated Oct. 7, 1976. The conventional solution comprises (see FIG. 1 of the publication):

a first terminal of the controller used to connect the controller to a high-potential terminal of the ECR;

a second terminal of the controller used to connect the controller to the first terminal of the sense resistor, which is a part of the ECR;

a third terminal (group of terminals) of the controller used to connect the controller to a control digital code source;

a fourth terminal of the controller which is used to connect the controller to the second terminal of the control digital code source;

a fifth terminal of the controller which is used to connect the controller to a low-potential terminal of the ECR;

a sixth terminal of the controller which serves as its output and is used to connect the controller to the control terminal of the active element, which is a part of the ECR.

The conventional controller further comprises an output operational amplifier and an intermediate operational amplifier, a repeater, an inverter, a bias resistor, a reference resistor, and a digital-to-analog converter, the repeater input being connected to the first terminal of the controller, and its output being connected to the first terminal of the reference resistor, and the second terminal of the reference resistor being connected to the inverting input of the intermediate operational amplifier;

the inverting input of the intermediate operational amplifier being also connected via the bias resistor to the digital-to-analog converter output, while the inputs of the digital-to-analog converter being connected to the third terminal (group of terminals) of the controller; and the noninverting input of the intermediate operational amplifier being connected to the fifth terminal of the controller, and its output being connected via the inverter to the noninverting input of the output operational amplifier, and the inverting input of the output operational amplifier being connected to the second terminal of the controller.

The main drawback of the conventional solution is that it does not allow to use changing resistance of variable resistors (a photoresistor, a thermistor, a digital potentiometer, etc.) for control.

Yet another conventional controller of resistance of a circuit portion is disclosed DE 3,239,309, dated Apr. 26, 1984. The conventional controller of resistance of a circuit portion comprises (see FIG. 2 of the publication):

a first terminal of the controller used to connect the controller to a high-potential terminal of the ECR;

a second terminal of the controller used to connect the controller to the first input of the current-to-voltage converter, which is a part of the ECR;

a third terminal of the controller used to connect the controller to the control voltage source designed as an digital-to-analog converter;

a fourth terminal of the controller used to connect the controller to the second terminal of the control voltage source;

a fifth terminal of the controller used to connect the controller to a low-potential terminal of the ECR;

a sixth terminal of the controller which serves as its output and is used to connect the controller to the control input of the active element, which is a part of the ECR.

The conventional controller further comprises an operational amplifier and an analog voltage-by-current divider, the inverting input of the operational amplifier being connected to the second terminal of the controller, while the noninverting input being connected to the analog voltage-by-current divider output.

The main drawback of the conventional solution is that it does not allow to use changing resistance of variable resistors (a photoresistor, a thermistor, a digital potentiometer, etc.) for control.

The closest analog (prototype) of the present invention, EP3182243A1, dated Jun. 21, 2017, discloses a conventional controller of resistance of a circuit portion and comprises (see FIG. 1 of the publication, which is the same as FIG. 1 of the present application):

a first terminal of the controller used to connect the controller to a high-potential terminal of the ECR;

a second terminal of the controller used to connect the controller to the first terminal of the sense resistor, which is a part of the ECR;

a third terminal of the controller used to connect the controller to the first terminal of the control resistor;

a fourth terminal of the controller used to connect the controller to the second terminal of the variable control resistor;

a fifth terminal of the controller used to connect the controller to a low-potential terminal of the ECR;

a sixth terminal of the controller which serves as its output and is used to connect the controller to the control input of the active element, which is a part of the ECR.

The conventional controller further comprises: an operational amplifier, a reference resistor, a constant voltage source, and a non-controllable current generator, the noninverting input of the operational amplifier being connected to the fourth terminal of the controller and to the first terminal of the reference resistor, and the second terminal of the reference resistor being connected to the fifth terminal of the controller.

The inverting input of the operational amplifier is connected to the second terminal of the controller.

The output of the operational amplifier is connected to the sixth terminal of the controller.

The first terminal and the third terminal of the controller are interconnected and further connected to the output of the non-controllable current generator, and the input of the generator is connected to the positive pole of the constant voltage source.

The main drawback of this conventional solution is its inability to use as a control resistor the digital potentiometers with a grounded terminal, such as ISL90728WIE627Z-TK, TPL0401A-10DCKR, MCP4018T-103E/LT and many others. Digitally controlled potentiometers have neither active elements, nor sense resistors, and thus are not considered to be closely related prior art.

Accordingly, there is a need in the art for a controller of an ECR that allows to precisely set the necessary resistance, at the same time providing a linear (proportional) dependence of the resistance of the ECR on the resistance of the various variable control resistors such as photoresistors, thermistors, digital potentiometers of any kind, including the digital potentiometers with a grounded terminal and so on).

SUMMARY OF THE INVENTION

The object of the present invention is to overcome the drawbacks of conventional solutions and to create controllers for ECRs, which would enable to precisely set the resistance (even a relatively small one) for a given circuit portion within a broad range, while also allowing to use various variable control resistors, including digital potentiometers of any kind, to set the necessary resistance, at the same time providing a linear (proportional) dependence of the resistance of the ECR on the resistance of the variable control resistor.

The technical result, believed impossible to be achieved by conventional solutions, involves employing digital potentiometers as variable control resistors to get low or ultra-low resistances in ECRs, which can be used within a broad range of working voltages and currents.

In the specification and the claims that follow, when it is described that an element is 'coupled' to another element, the element may be "directly coupled" to the other element or "electrically coupled" to the other element through a third element.

In addition, unless explicitly described to the contrary, the word "comprise" and variations such as "comprises" or "comprising", will be understood to imply the inclusion of stated elements but not the exclusion of any other elements.

In one aspect of the invention, to achieve the above-stated technical result there is provided an electronic controller for an ECR (see, for example, FIG. 2), that may include:

- a current generator that outputs an output current;
- an amplifier receiving an input voltage that is proportional to the output current, and outputting an amplified input voltage to a first input of an adder;
- a voltage divider including a bias resistor and a reference resistor connected in series between a high-potential terminal and a low-potential terminal of the ECR;
- a buffer stage receiving an output of a sense resistor of the ECR, and outputting a buffered voltage to the current generator and to a second input of the adder, wherein the adder outputs an adder voltage.

Additionally, the electronic controller for an ECR may include an operational amplifier receiving the voltage from a midpoint of the divider at its first input and the summed voltage at its second input, and outputting a control voltage to an active element of the ECR.

Also, a variable control resistor is connected by one of its terminals to the low-potential terminal of the ECR, and to the current output of the controller by another terminal thereof, wherein the input voltage of the controller is the voltage across the variable control resistor.

Optionally, the active element may include a MOSFET transistor.

Optionally, the current generator is a controllable current generator.

Optionally, the active element and the sense resistor of the ECR are connected in series.

Optionally, the controllable current generator (see, for example, FIG. 3) includes

- a second operational amplifier receiving an output voltage of the buffer stage and a voltage that is proportional to resistance of a first resistor of the controllable current generator;
- a first transistor receiving an output voltage of the second operational amplifier and outputting a master current to the first resistor;
- a second resistor connected in series between a voltage source and the first transistor, a common node of the second resistor and the first transistor being connected to a first input of a third operational amplifier;
- a third resistor connected in series between the voltage source and the second transistor, a common node of the third resistor and a second transistor being connected to a second input of the third operational amplifier;
- and the second transistor receiving an output voltage of the third operational amplifier and providing the controllable current to the output of the controllable current generator.

In another aspect of the invention, an ECR comprising the above controller may include:

- a current generator that outputs an output current;
- an amplifier receiving an input voltage that is proportional to the output current and to the value of the variable control resistor, and outputting an amplified input voltage to a first input of an adder;
- a voltage divider including a bias resistor and a reference resistor connected in series between a high-potential terminal and a low-potential terminal of the ECR;
- an active element and a sense resistor connected in series between the high-potential terminal and the low-potential terminal of the ECR;
- a buffer stage receiving an output of the sense resistor of the ECR, and outputting a voltage to the current generator and to a second input of the adder, wherein
- the adder outputs a summed voltage.

Additionally, the ECR controller may comprise an operational amplifier receiving the voltage from a midpoint of the divider at its first input and the summed voltage at its second input, and outputting a control voltage to the active element of the ECR.

Optionally, a variable control resistor is connected to the low-potential terminal of the ECR by one of its terminals, and to the current output of the controller by another terminal thereof, wherein the input voltage of the controller is the voltage across the variable resistor.

Optionally, the active element of the ECR is a MOSFET transistor.

Optionally, the current generator is a controllable current generator.

Optionally, the controllable current generator includes:

- a second operational amplifier receiving an output voltage of the buffer stage and a voltage that is proportional to resistance of a first resistor of the controllable current generator;

a first transistor receiving an output voltage of the second operational amplifier and outputting a master current to the first resistor;

a second resistor connected in series between a voltage source and the first transistor, a common node of the second resistor and the first transistor being connected to a first input of a third operational amplifier;

a third resistor connected in series between the voltage source and the second transistor, a common node of the third resistor and a second transistor being connected to a second input of the third operational amplifier; and the second transistor receiving an output voltage of the third operational amplifier and outputting the controllable current of the controllable current generator.

Additional features and advantages of the present invention will be set forth in the description that follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in, and constitute a part of, this specification, illustrate embodiments of the invention and together with the description serve to explain the principles of the invention. In the drawings.

DETAILED DESCRIPTION OF THE INVENTION

Figure 1:
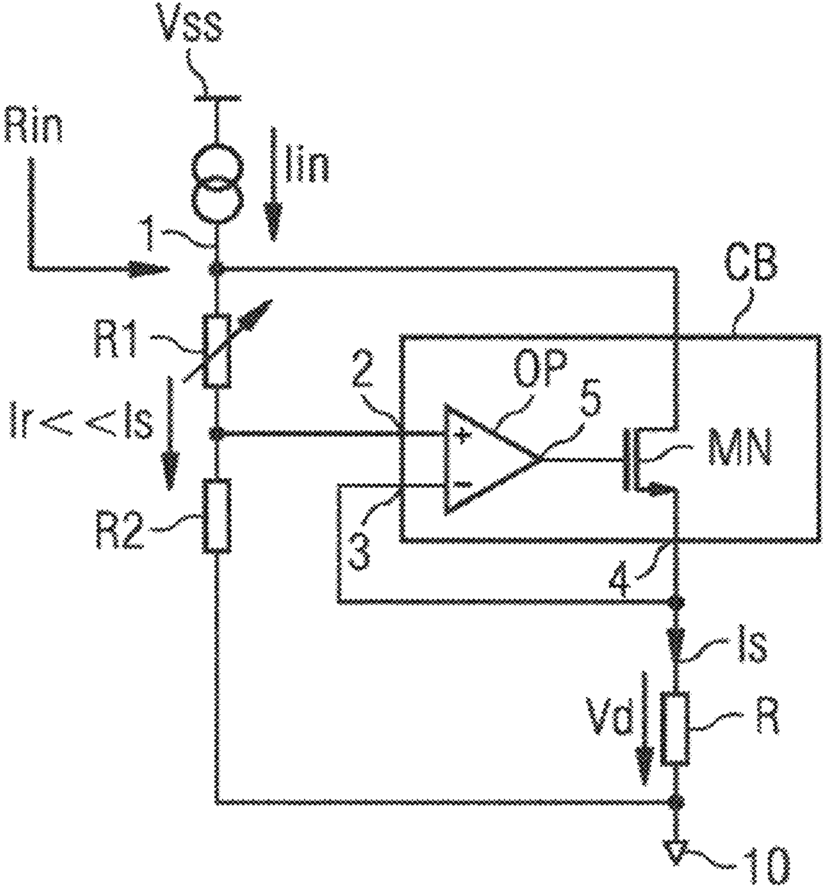
FIG. 1 illustrates a conventional controller (Prior art).

Reference will now be made in detail to the implementation features of the present invention illustrated in the accompanying drawings.

In order to achieve the technical result stated above, the proposed controller includes (see FIG. 2, which illustrates an exemplary embodiment of the controller 220 for controlling the ECR 222) the following elements and connections thereof:

a first terminal 1 of the controller 220 used to connect the controller 220 to a first terminal of the variable control resistor Rc;

a second terminal 2 of the controller 220 used to connect the controller 220 to a first terminal of a sense resistor Rsense, which is a part of the ECR 222;

a third terminal 3 of the controller 220 used to connect the controller 220 to a control terminal of an active element 224, which is a part of the ECR 222;

a fourth terminal 4 of the controller 220 used to connect the controller 220 to a second terminal of the variable control resistor Rc;

a fifth terminal 5 of the controller 220 used to connect the controller 220 to a low-potential terminal 12 of the ECR 222;

a sixth terminal 6 of the controller 220 used to connect the controller 220 to a high-potential terminal 10 of the ECR 222;

an operational amplifier 208;

a reference resistor Rref; and a constant voltage source (e.g., a battery) 214, wherein a noninverting input of the operational amplifier 208 is connected to a first terminal of the reference resistor Rref, a second terminal of the reference resistor Rref is connected to the fifth terminal 5 of the controller 220, and the output of the operational amplifier 208 is connected to the third terminal 3 of the controller 220.

The controller 220 is further equipped with:

a bias resistor Rbias;

an amplifier 204;

an adder 206;

a buffer stage 210; and a controllable current generator 212, wherein a first terminal of the bias resistor Rbias is connected to the sixth terminal 6 of the controller 220, a second terminal of the bias resistor Rbias is connected to a noninverting input of the operational amplifier 208;

the amplifier 204 input is connected to the first terminal 1 of the controller, and the amplifier 204 output is connected to a first input of the adder 206, while the adder 206 output is connected to an inverting input of the operational amplifier 208;

the second terminal 2 of the controller is connected to the input of the buffer stage 210, and the output of the buffer stage 210 is connected to both a second input of the adder 206 and a control input of the controllable current generator 212;

a power input 22 of the controllable current generator 212 is connected to the positive terminal of a DC power source 214, and the negative terminal of the DC power source 214 is connected to the common wire; and the output 26 of the controllable current generator 212 is connected to the first terminal 1 of the controller to transmit controlling action therethrough, i.e., changing resistance of the variable control resistor Rc.

By adding the bias resistor Rbias, the amplifier 204, the adder 206, the buffer stage 210, and the controllable current generator 212 with corresponding connections in accordance with the proposed invention, it is possible during the conversion of the voltage U1 at the high-potential terminal 10 of the ECR 222, to create a potential at the noninverting input of the operational amplifier 208:

$$U1' = U1 * Rref/(Rref + Rbias), \tag{1}$$

where Rbias is the resistance of the bias resistor, and Rref is the resistance of the reference resistor.

At the same time, the inverting input of the operational amplifier 208 receives a summed signal S that is composed of the following summands:

The first summand $S_1$ is transmitted from the first terminal 1 of the proposed controller 220 through the amplifier 204 with the amplification coefficient K' to the first input of the adder 206. The first summand is represented by an amplified voltage drop at the variable control resistor Rc caused by the current Icg that is produced by the controllable current generator 212, i.e.

$$S_1 = K' * Icg * Rc \quad (2)$$

The second summand $S_2$ is transmitted from the second terminal 2 of the proposed controller through the buffer stage 210 with a unitary transmission ratio to the second input of the adder 206. The second summand is represented by the voltage $U_2$ of the sense resistor $R_{sense}$, which is a part of the ECR 222 that is controlled by the proposed controller 220. This voltage is defined using the following formula:

$$U_2 = I_0 * R_{sense}, \quad (3)$$

where Rsense is the sense resistor value, which may be as small as possible in terms of implementation, and
$I_0$ is the current that flows through the ECR 222 and that is defined by the active element 224, which is a part of the ECR 222.
Therefore, $$S_2 = U_2 = I_0 * R_{sense}, \quad (4)$$

and the summed signal S at the inverting input of the operational amplifier 208 is $$S = S_1 + S_2 = K' * Icg * Rc + I_0 * R_{sense} \quad (5)$$

Now, consider that the current Icg of the controllable current generator 212 depends on the voltage $U_2$ that is transmitted from the buffer stage 210 output to the control input 24 of the controllable current generator, i.e., $$Icg = U_2 * Gcg = I_0 * R_{sense} * Gcg, \quad (6)$$

where Gcg is the coefficient of conversion of the control voltage $U_2$ into the current that has dimension of conductivity.
Therefore, based on formulas (5) and (6), $$S = K' * I_0 * R_{sense} * Gcg * Rc + I_0 * R_{sense} = I_0 * R_{sense} * (1 + K' * Rc * Gcg) \quad (7)$$

The difference between $U_1'$ and S at the operational amplifier 208 output is transmitted as the controlling signal $U_{contr}$ ($U_{contr}=U_1'-S$) to the third terminal 3 of the controller 220 used to connect the controller to the control terminal of the active element 224, which is a part of the ECR 222, i.e., to the proposed controller's output. Because of a high amplification coefficient in the feedback chain (operational amplifier 208—active element 224 of the ECR—sense resistor $R_{sense}$—buffer stage 210—adder 206—operational amplifier 208), the relation $U_1' \approx S$ is true with practically satisfactory accuracy.

Therefore, per (1) and (7)

$$U_1 * R_{ref}/(R_{ref} + R_{bias}) = I_0 * R_{sense} * (1 + K' * Rc * Gcg) \quad (8)$$

from which it follows that the resistance of the ECR between a high-potential terminal 10 and a low-potential terminal 12 is:

$$R_0 = U_1/I_0 = R_{sense} * (1 + K' * Rc * Gcg)/(1 + R_{bias}/R_{ref}) \quad (9)$$

The formula (9) shows that the resistance of the ECR according to the present disclosure is directly proportionate to the resistance of the sense resistor $R_{sense}$ and to the value of controlling action, which corresponds to the resistance of variable control resistor Rc (e.g., a digital potentiometer). The formula (9) also shows that it is possible to obtain low and ultra-low $R_o$ values at low $R_{sense}$, in case both following relations are true:

$$Rc * (K' * Gcg) << 1 \text{ and } R_{bias} \approx R_{ref} \quad (10)$$

The variable control resistor Rc, like in conventional solutions, may be represented by a mechanical potentiometer, a photoresistor, or a thermistor.

Unlike the prototype, the proposed circuit has the advantage of employing digital potentiometers as control resistors to get low or ultra-low resistances in ECRs, which can be used within a broad range of working voltages and currents, thus achieving the technical result above.

The proposed controller for an ECR 222 according to FIG. 2 functions as follows. When the controlling action is changed, which corresponds to the change in resistance of the variable control resistor Rc (e.g., a digital potentiometer), the voltage $U_{Rc}$ is transmitted from this resistor through the amplifier 204 with the transmission coefficient K' to the first input of the adder 206 as the first summand $S_1=K'*U_{Rc}$. The second summand $S_2$ represented by the voltage $U_2$ is transmitted from the sense resistor $R_{sense}$, which is a part of the ECR 222, through a buffer stage 210 to the second input of the adder 206. This voltage is determined using the formula (3), i.e., $U_2=I_0*R_{sense}$, and, therefore, $S_2=I_0*R_{sense}$ (see formula (4)), where $R_{sense}$ is the sense resistor value, which may be as small as possible in terms of implementation. The voltage $U_2$, as shown above, is equal to the voltage drop at the sense resistor $R_{sense}$ caused by the current $I_0$, that flows through the ECR 222. In reality, the current $I_0$ flows through the following chain: the high-potential terminal 10 of the ECR 222—the active element 224—the sense resistor $R_{sense}$ that is connected in series to the active element 224—the low-potential terminal 12 of the ECR 222, due to the potential difference $U_1$ between the high-potential terminal 10 and the low-potential terminal 12 of the ECR 222.
Therefore, by summing the voltages K'*URc and $U_2$, i.e. $K'*U_{Rc}=S_1$ and $U_2=S_2=I_0*R_{sense}$, an intermediate signal is generated at the output of the adder 206:

$$S = S_1 + S_2 = K' * U_{Rc} + I_0 * R_{sense}, \quad (11)$$

which is then received by the inverting input of the operational amplifier 208.

At the same time, the constant potential $U_{1'}$ which is equal (see formula (1)) to $U_{1'}=U_1/(1+R_{bias}/R_{ref})$, is transmitted from the terminal 6 of the controller 220 through a voltage divider formed by the bias resistor $R_{bias}$ and the reference resistor $R_{ref}$ to the noninverting input of the operational amplifier 208. Transmitted from the output of the operational amplifier 208 to the third terminal 3 of the proposed controller 220 used to connect to the control terminal of the active element 224, which is a part of the ECR 222, i.e., to the output of the proposed controller 220, is the difference between S and $U_{1'}$ as the control voltage Ucontr (Ucontr=$U_1$'−S). This voltage $U_{contr}$ is transmitted from the output of the proposed controller 220 to the control terminal of the active element 224.

However, if the intermediate signal S value at the inverting input of the operational amplifier 208 is higher than the voltage $U_{1'}$, then the voltage $U_{contr}$ at the control terminal of the active element 224 half-closes the active element 224, reducing the current $I_0$ and causing the voltage $U_2$ to fall, which is transmitted through the buffer stage 210 to the second input of the adder 206 as the second summand $S_2=I_0*R_{sense}$, see formula (4).

In addition, the voltage $U_2$ is transmitted to the control input 24 of the controllable current generator 212, decreasing current $I_{cg}$ thereof according to the formula (6):

$$I_{cg}=U_2*G_{cg}=I_0*R_{sense}*G_{cg},$$

where $G_{cg}$ is the coefficient of conversion of the control voltage $U_2$ into the current that has conductivity dimension. The decreasing of current $I_{cg}$ of the controllable current generator 212 causes the decreasing of voltage drop at the variable control resistor $R_c$ (e.g., a digital potentiometer), and, consequently, decreased after being amplified K' times in the amplifier 204 is the first summand $S_1$ at the first input of the adder 206 (see formulas (2) and (6)):

$$S_1=K'*I_{cg}*R_c=I_0*R_{sense}*G_{cg}*K'*R_c \tag{12}$$

By summing the summands $S_1$ and $S_2$ in the adder 206, an intermediate signal S is generated at the adder's 206 output, see formula (7): $S=I_0*R_{sense}*(1+K'*Rc*G_{cg}$ which signal S decreases due to the current $I_0$ fall as it is described above.

Due to a high amplification coefficient of the operational amplifier 208, this process will persist until the intermediate signal S at the inverting input of the operational amplifier 208 becomes equal to the voltage $U_{1'}$ at the noninverting input of the operational amplifier 208. Conversely, if the intermediate signal S value at the adder 206 output is lower than the voltage $U_{1'}$, then the voltage $U_{contr}$ at the control terminal of the active element 224 half-opens the active element 224, increasing the current $I_0$ therethrough and causing the voltage $U_2$ to increase, which voltage is transmitted through the buffer stage 210 to the second input of the adder 206 as the second summand $S_2=I_0*R_{sense}$ (see formula (4)). In addition, the voltage $U_2$ is transmitted to the control input 24 of the controllable current generator 212, increasing its current $I_{cg}$ according to the formula (6): $I_{cg}=U_2*G_{cg}=I_0*R_{sense}*G_{cg}$.

The summand $S_1$ also increases, see formula (12): $S_1=I_0*R_{sense}*G_{cg}*K'*R_c$ By summing the increasing summands $S_1$ and $S_2$ in the adder 206, an intermediate signal S that is described by the formula (7) is generated at the adder 206's output. The intermediate signal increases due to the current $I_0$ increase as described above.

Due to a high amplification coefficient of the operational amplifier 208, this process will persist until the intermediate signal S at the inverting input of the operational amplifier 208 becomes equal to the voltage $U_{1'}$ at the noninverting input of the operational amplifier 208, i.e., $S=U_{1'}$. Therefore, because of a high gain feedback that loops around the operational amplifier 208—the active element 224 of the ECR 222—the sense resistor $R_{sense}$—the buffer stage 210—the adder 206—the operational amplifier 208, the relation $S=U_{1'}$ will always be true for the claimed invention with practically satisfactory accuracy.

Or, by substituting the corresponding values from (1) and (11), we get formula (8) again:

$$U_1*R_{ref}/(R_{ref}+R_{bias})=I_0*R_{sense}*(1+K'*R_c*G_{cg})$$

Equation (8) is reliably true even under various destabilizing factors, including wide temperature fluctuations, thanks to the high gain feedback.

Consider now that the resistance $R_0$ between the high-potential terminal 10 and the low-potential terminal 12 of the ECR 222 is the quotient of the voltage $U_1$ by the current $I_0$ that flows through the chain (the high-potential terminal 10—active element 224—sense resistor $R_{sense}$ connected in series to the active element 224—the low-potential terminal 12), i.e., $$R_0=U_1/I_0 \tag{13}$$

The relations (8) and (13) produce the value of resistance between the high-potential terminal 10 and the low-potential terminal 12 of the ECR 222:

$$R_0=U_1/I_0=R_{sense}*(1+K'*R_c*G_{cg})/(1+R_{bias}/R_{ref}),$$

which corresponds to the formula (9).

Therefore, it is proved, by generating an intermediate signal at the adder 206 output as in (7):

$$S=I_0*R_{sense}*(1+K'*R_c*G_{cg}),$$

forwarding this signal to the second (inverting) input of the operational amplifier 208, transmitting the potential (see formula (1)):

$$U_{1'}=U_1/(1+R_{bias}/R_{ref})$$

to the first (noninverting) input of the operational amplifier 208, and ensuring that the equality $S=U_{1'}$ is true due to the high gain feedback, that the resistance $R_0$ of the ECR 222 of the present disclosure is directly proportionate to the resistance of the sense resistor $R_{sense}$ and is also proportionate to the value of the control action, which corresponds to the resistance of the variable control resistor $R_c$ (e.g., a digital potentiometer).

The formula (9) means that it is possible to obtain low and ultra-low $R_O$ values at a relatively high current $I_0$ that is provided by the active element 224. Therefore, to control the resistance of a circuit portion, a controlling action that corresponds to the resistance of the variable control resistor Rc (e.g., a digital potentiometer) is used, wherein the resistance of the ECR 222 is proportionate to the controlling action that corresponds to the value of the variable resistor Rc (e.g., a digital potentiometer).

Figure 3:
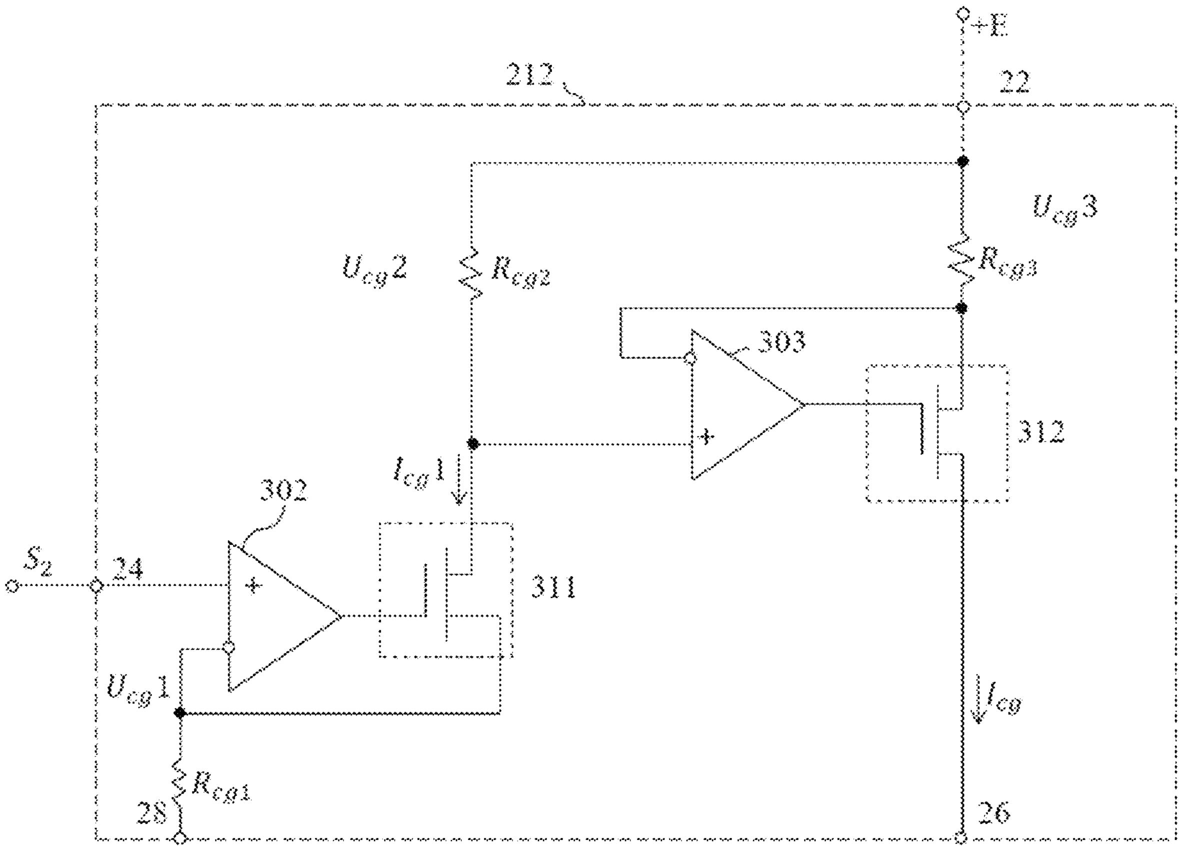
FIG. 3 illustrates an exemplary embodiment of the controllable current generator that may be used in the controller.

In FIG. 3, the following elements of the controllable current generator 212 are shown:

302—a second operational amplifier;
303—a third operational amplifier;
311—a first MOSFET transistor;
312—a second MOSFET transistor;
$R_{cg1}$—a first resistor of the controllable current generator 212;
$R_{cg2}$—a second resistor of the controllable current generator 212;
$R_{cg3}$—a third resistor of the controllable current generator 212;

The controllable current generator 212 of FIG. 3 functions as follows.

The signal $S_2$ (a controlling signal for the controllable current generator 212) is transmitted to the control input 24 thereof and then forwarded to the noninverting input (+) of the second operational amplifier 302, the output thereof being connected to the gate of the first MOSFET transistor 311. The source of the first MOSFET transistor 311 is connected to the inverting input (−) of the second operational amplifier 302 and to the first terminal of the first resistor $R_{cg1}$ of the controllable current generator 212. The second terminal 28 of the first resistor $R_{cg1}$ is connected to the low-potential terminal 12 of the ECR 222 (see also FIG. 2). The current $I_{cg1}$ is flowing through the drain-source chain of the first MOSFET transistor 311, causing a voltage drop at the first resistor $R_{cg1}$ of the controllable current generator 212:

$$U\,cg1 = Icg1 * Rcg1 \tag{14}$$

Because of a high gain feedback looping around both the second operational amplifier 302 and the first MOSFET transistor 311, the signal $S_2$ at the noninverting input (+) of the second operational amplifier 302 and the voltage $U_{cg1}$ at its inverting input (−) can be considered equal for practical purposes, and thus:

$$S_2 = U_{cg1} \tag{15}$$

Therefore, the current flowing through the first MOSFET transistor 311 is $$I_{cg1} = S_2/R_{cg1}, \tag{16}$$

and it causes a voltage drop at the second resistor $R_{cg2}$ of the controllable current generator 212:

$$U_{cg2} = I_{cg1} * R_{cg2} \tag{17}$$

Since the first terminal of the second resistor $R_{cg2}$ is connected to the terminal 22 of the controllable current generator 212, which receives the power voltage E and the second terminal of the second resistor $R_{cg2}$ is connected to the non-inverting input (+) of the third operational amplifier 303, the following voltage appears there:

$$U_{+303} = E - U_{cg2} \tag{18}$$

The output of the third operational amplifier 303 is connected to the gate of the second MOSFET transistor 312, and the transistor's drain is connected to the inverting input (−) of the third operational amplifier 303 and to the first terminal of the third resistor $R_{cg3}$, and the second terminal of the third resistor $R_{cg3}$ is connected to the terminal 22 of the controllable current generator 212, which receives the power voltage E.

The output current $I_{cg}$ of the controllable current generator 212 is flowing through the drain-source chain of the second MOSFET transistor 312 to the terminal 26 of the controllable current generator 212, causing a voltage drop at the third resistor $R_{cg3}$ of the controllable current generator 212:

$$U_{cg3} = I_{cg} * R_{cg3} \tag{19}$$

As a result, the inverting input (−) of the third operational amplifier 303 receives the following voltage from the first terminal of the third resistor $R_{cg3}$:

$$U_{-303} = E - U_{cg3} \tag{20}$$

Because of a high gain feedback looping around both the third operational amplifier 303 and the second MOSFET transistor 312, the voltages at the noninverting input (+) and the inverting input (−) of the third operational amplifier 303 can be considered equal for practical purposes, and thus:

$$U_{+303} = U_{-303} \tag{21}$$

Therefore, see (18) and (20):

$$U_{cg2} = U_{cg3} \tag{22}$$

And, considering (17) and (19)

$$I_{cg1} * R_{cg2} = I_{cg} * R_{cg3} \tag{23}$$

Therefore, the output current $I_{cg}$ of the controllable current generator 212 is $$I_{cg}=I_{cg1}*R_{cg2}/R_{cg3} \quad (24)$$

And since $I_{cg1}$ depends on the control signal $S_2$ (see equation (16)), the result is:

$$I_{cg}=S_2*R_{cg2}/(R_{cg1}*R_{cg3}) \quad (25)$$

Or, since the signal $S_2$ is identically equal to the voltage $U_2$ that is received from the sense resistor $R_{sense}$, which is a part of the ECR 222, the final result is:

$$I_{cg}=U_2*R_{cg2}/(R_{cg1}*R_{cg3}) \quad (26)$$

And this current does not depend on resistance of the variable control resistor $R_c$, that is external in regard to the controllable current generator 212, but depends only on resistances of the internal resistors of the controllable current generator 212 and control voltage $U_2$ across the sense resistor $R_{sense}$.

The value $$G_{cg}=R_{cg2}/(R_{cg1}*R_{cg3}) \quad (27)$$

characterizes the coefficient of conversion of the control voltage $U_2$ into current, has the dimension of conductivity and is used when determining the resistance of the ECR 222 according to the present disclosure. Therefore, the controllable current generator 212, which is designed, for instance, according to FIG. 3, enables the proposed controller 220 to function in order to achieve the stated technical result.

The controllable current generator can be implemented by various methods, for example, e.g., as described in «LT 1789. Micropower, Single Supply Rail-to-Rail Output Instrumentation Amplifiers Description» LINEAR TECHNOLOGY CORPORATION 2002, drawing «0.5 A to 4 A Voltage Controlled Current Source» (see also https://www.analog.com/ru/products/lt1789.html#product-overview).

The controllable current generator 212 also can be implemented, for example, according to article «How should I design variable current source of 4-20 mA with 24 Vdc input?», see Electrical Engineering Stack Exchange, or https://electronics.stackexchange.com/questions/72192/how-should-i-design-variable-currentsource-of-4-20ma-with-24vdc-input?rq=1).

The controllable current generator 212 also may be designed on the basis of IC LT 6552, as shown in "Voltage controlled current source—ground referred input and output», Jim Williams, in Analog Circuit Design, 2013 (Controlled Current Source—an overview|ScienceDirect Topics), and numerous other options.

The voltage divider may be implemented as a resistive divider, or as divider consisting of two transistors connected in series, or in any other way that permits to forward to the noninverting input of the operational amplifier 208 a part of voltage from high-potential terminal 10 of the ECR 222.

The voltage divider also may be external in regard to controller 220 and connected to it through a separate terminal, which makes it possible not to forward voltage from high-potential terminal 10 of the ECR 222 to controller 220.

The amplifier 204, the buffer stage 210 and the adder 206 can be implemented in different ways allowing performance ability of the claimed controller.

The controller 220 can be made of standard discrete components, such as for op amps, transistors and resistors, or integrated circuits including ASICs.

For example, the amplifier 204, the buffer 210, the current generator 212 can be made using integrated circuits such as OPA189, TLV9002IDR, MCP6002-E/SN and many others. The primary parameters should preferably be: OPEN-LOOP GAIN (RL=10 kΩ) at least 100 dB; Gain-bandwidth product at least 1 MHz, rail-to-rail input and output. Similar components can be used for operational amplifier 208. As transistors for the controllable current generator 212, NTNUS3171PZ. NX3020NAK and similar can be used, with parameters RDS (on) up to 5.5 Ohm, drain current $I_0$ at least 100 mA.

Other components of the ECR 222 (e.g., the adder 206, the DC voltage source 214) are known in the art, and can be implemented in any known way.

Nominal resistor values are as follows:

$R_{bias}$ in the range of 100 . . . 200 KOhm;

$R_{ref}$ in the range of 50 . . . 100 KOhm.

$R_{cg1}$, $R_{cg2}$, $R_{cg3}$ are typically in the range of 200 Ohm . . . 1 KOhm.

The value of $R_{sense}$ depends on the nominal desired value of the ECR 222, and is typically 10mOhm and higher (e.g., up to 100 Ohm).

Various transistors, including MOSFET, e.g., STT6N3LLH6 transistor or its analogs can be used as the active element, as long as its RDS (on) is an order of magnitude less than the nominal ECR 222 value.

The proposed controller 220 for ECR 222 can be made, for example, as a chip or a chip assembly or a microplate. The ECR 222 also can be made, for example, as a chip or a chip assembly or a microplate.

The preferred embodiment of the controller 220 for an ECR 222 is in the form of an integrated circuit, which permits reducing the size substantially, and manufacturing costs. For relatively low-power ECRs (total power dissipated by the active element and the sense resistor up to about 1-2 watts), it is preferably to implement the controller, the active element and the sense resistor as a single integrated circuit. In any case, the voltage divider may be external or internal in relation to this chip.

Experimental Findings

Figure 2:
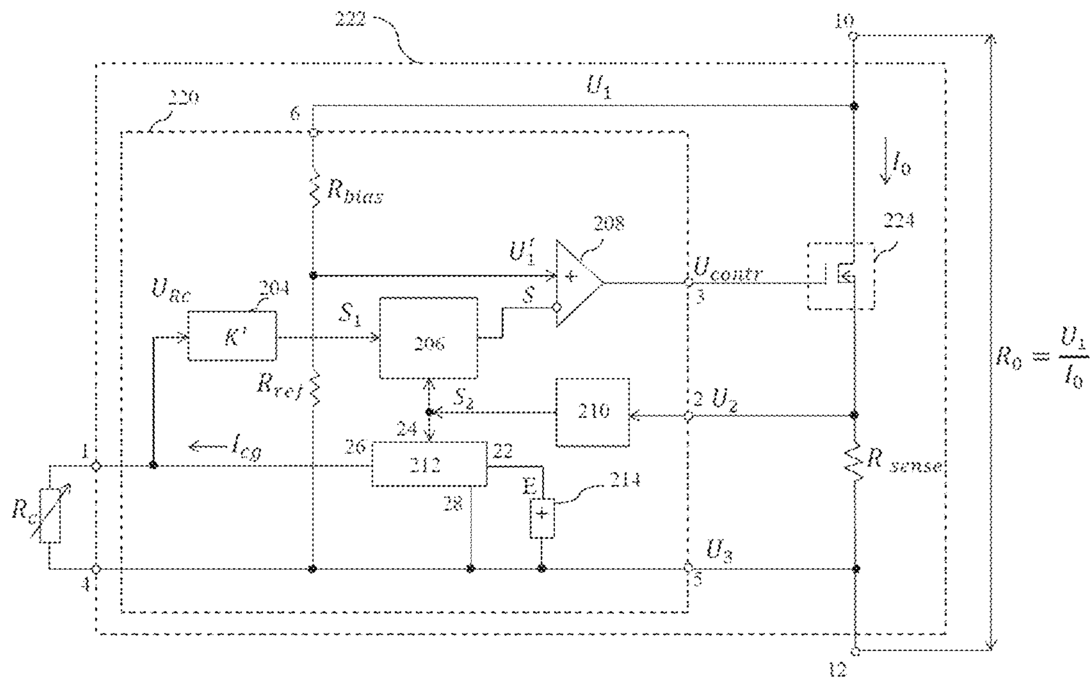
FIG. 2 illustrates an exemplary embodiment of the controller of an ECR, controlled by a changing voltage of a variable control resistor, e.g., a mechanical potentiometer, a photoresistor, a thermistor, a digital potentiometer, etc.

The proposed controller 220 of FIG. 2 and FIG. 3 was prototyped in order to confirm that the objective of the invention is attainable.

Prototyping results were as follows:

Power supply voltage: 5 V±5%

Minimum resistance of the variable control resistor $R_c$ (e.g., a digital potentiometer): 100 Ohm Maximum resistance of the variable control resistor $R_c$ (e.g., a digital potentiometer): 10,000 Ohm Minimum resistance of the ECR $R_{0min}$: 383.5 Ohm Maximum resistance of the ECR $R_{0max}$: 26,225.9 Ohm ECR Resistance adjustment range by 68.4 times.

The nonlinearity of dependence between the resistance of an ECR 222 and that of the resistor $R_c$ (e.g., a digital potentiometer) does not exceed 1.4%.

Figure 4:
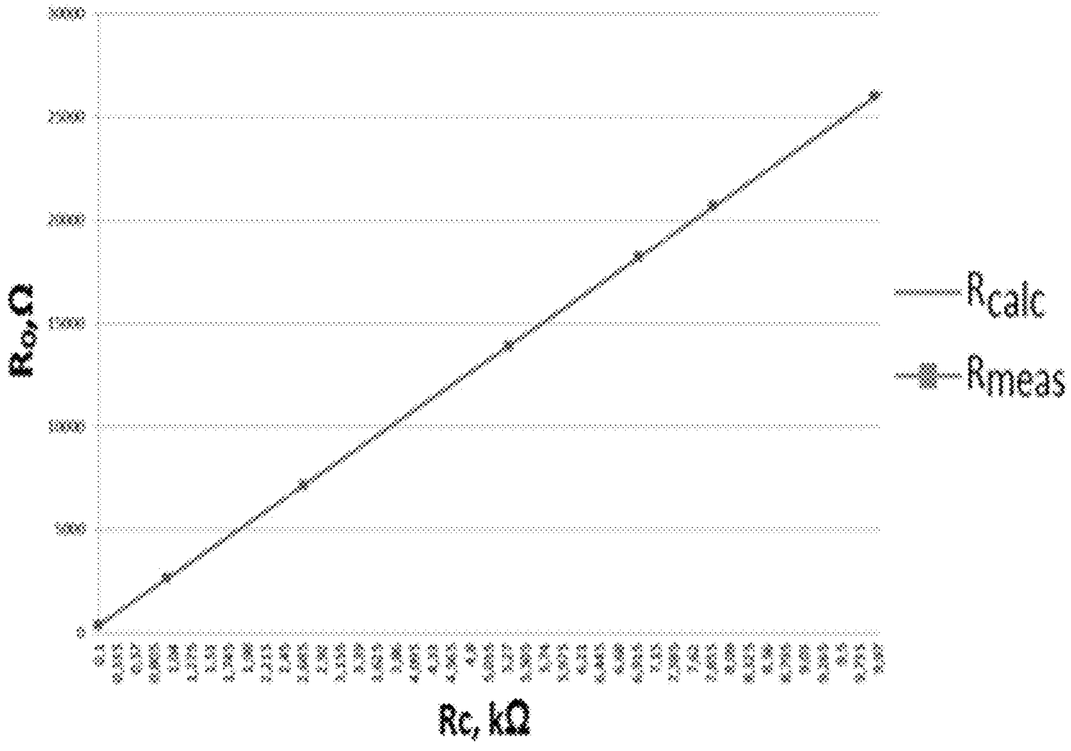
FIG. 4 illustrates experimental results of prototyping the controller.

The dependence between the resistance $R_0$ of the ECR 222 and that of the variable control resistor $R_c$ is shown as a straight line in FIG. 4. The resistance measurements are not distinguished by appearance from predictions/estimates.

Therefore, it should be seen from the above that the present invention successfully achieves the above technical result. However, the present invention is not limited thereto.

It is disclosed based on what can currently be considered a feasible implementation of various embodiments of the controller.

It is to be understood, however, that the claimed invention is not limited to the disclosed embodiments, but, on the contrary, is intended to cover various modifications and equivalent arrangements included within the spirit and scope of the appended claims.

Accordingly, the drawings and the description of the present invention are only illustrative and do not limit the scope of its implementation.

The present invention is further defined by the following claims.

The invention claimed is:

1. A controller (220) for an electronically controlled resistor (ECR) (222), comprising:

a first operational amplifier (208), a reference resistor $R_{ref}$, a constant voltage source (214), a bias resistor $R_{bias}$, an adder (206), a controllable current generator (212), a first terminal (1) of said controller (220) for connecting to a first terminal of an external variable control resistor $R_c$, a second terminal (2) of said controller (220) for receiving a feedback signal from a common node of an external sense resistor $R_{sense}$ and an external active element (224), a third terminal (3) of said controller (220) for connecting to a control terminal of the external active element (224), a fourth terminal (4) of said controller (220) for connecting to a second terminal of the external variable control resistor $R_c$, a fifth terminal (5) of said controller (220) for connecting to a low-potential terminal (12) of the ECR (222), a sixth terminal (6) of said controller (220) for connecting to a high-potential terminal (10) of the ECR (222), the fourth terminal (4) and the fifth terminal (5) of the controller (220) being connected to each other, an output of the first operational amplifier (208) being connected to the third terminal (3) of said controller (220), a first terminal of the reference resistor $R_{ref}$ being connected to a non-inverting input of the first operational amplifier (208) and a second terminal of the reference resistor $R_{ref}$ being connected to the fifth terminal (5) of said controller (220), a first terminal of the bias resistor $R_{bias}$, being connected to the sixth terminal (6) of said controller (220), a second terminal of the bias resistor Rbias, being connected to the non-inverting input of the first operational amplifier (208), a first input of the adder (206) being connected to the first terminal (1) of said controller (220), a second input of the adder (206) being connected to the second terminal (2) of said controller (220), an output of the adder (206) beings connected to an inverting input of the first operational amplifier (208), the controllable current generator (212) comprising a second operational amplifier (302), a third operational amplifier (303), a first transistor (311), a second transistor (312), a first resistor $R_{cg1}$, a second resistor $R_{cg2}$, and a third resistor $R_{cg3}$, a control input (24) of the controllable current generator (212) being connected to the second (2) terminal of the controller (220) and to a non-inverting input of the second operational amplifier (302), an inverting input of the second operational amplifier (302) being connected to a common node of the first transistor (311) and the first resistor $R_{cg1}$ connected in series, an output of the second operational amplifier (302) being connected to a gate of the first transistor (311), an output (26) of the controllable current generator (212) being connected to the first terminal (1) of said controller (220), to the inverting input of the first operational amplifier (208) and to the second transistor (312), an output of the third operational amplifier (303) being connected to a gate of the second transistor (312), a non-inverting input of the third operational amplifier (303) being connected to a common node of the first transistor (311) and the second resistor $R_{cg2}$ connected in series, an inverting input of the third operational amplifier (303) being connected to a common node of the second transistor (312) and the third resistor $R_{cg3}$ connected in series, a common node of the second $R_{cg2}$ and third $R_{cg3}$ resistors being connected to a terminal (22) of the controllable current generator (212) for connecting to the constant voltage source (214) to power the controllable current generator.

2. The controller (220) of claim 1, further comprising a buffer stage (210) connected between the second terminal (2) of said controller (220) and an input (24) of the controllable current generator (212), an output of the buffer stage (210) being also connected to the first input of the adder (206).

3. The controller (220) of claim 1, further comprising an amplifier (204) connected between the first terminal (1) of said controller (220) and the second input of the adder (206).

4. An electronically controlled resistor (ECR) (222) for use with a variable control resistor $R_c$, the ECR comprising:

a high-potential terminal (10), an active element (224), a sense resistor $R_{sense}$, a low-potential terminal (12), and a controller (220) according to claim 1, the high-potential terminal (10), the active element (224), the sense resistor $R_{sense}$, and the low-potential terminal (12) being connected in series, the high-potential terminal (10) being connected to a sixth terminal (6) of the controller (220), the low-potential terminal (12) being connected to a fifth terminal (5) of the controller (220), a control terminal of the active element (224) being connected to a third terminal (3) of the controller (220), a common node of the sense resistor $R_{sense}$ and the active element (224) being connected to a second terminal (2) of the controller (220), a first terminal (1) of the controller (220) being designed for connecting to a first terminal of the external variable control resistor $R_c$, and a fourth terminal (4) of the controller (220) being designed for connecting to a second terminal of the external variable control resistor $R_c$.

5. The ECR (222) of claim 4, wherein the active element (224) is a transistor.

6. An integrated circuit (IC) for a controller (220) for an ECR (222), the IC comprising:

a first operational amplifier (208), a reference resistor $R_{ref}$, a bias resistor $R_{bias}$, a first terminal (1) designed for connecting to a first terminal of an external variable control resistor Rc, a second terminal (2) designed for receiving a feedback signal from a common node of an external sense resistor $R_{sense}$ and an external active element (224), a third terminal (3) designed for connecting to a control terminal of the external active element (224), a fourth terminal (4) designed for connecting to a second terminal of the external variable control resistor $R_c$, a fifth terminal (5) designed for connecting to a low-potential terminal (12) of the ECR (222), a sixth terminal (6) designed for connecting to a high-potential terminal (10) of the ECR (222), an adder (206), and a controllable current generator (212), the controllable current generator (212) comprising a second operational amplifier (302), a third operational amplifier (303), a first transistor (311), a second transistor (312), a first resistor $R_{cg1}$, a second resistor $R_{cg2}$, and a third resistor $R_{cg3}$, a control input (24) of the controllable current generator (212) being designed for connecting to the second terminal (2) and to a non-inverting input of the second operational amplifier (302), an inverting input of the second operational amplifier (302) being connected to a common node of a source of the first transistor (311) and the first resistor $R_{cg1}$ connected in series, a second terminal of the first resistor $R_{cg1}$ being connected to the terminal (28) of the controllable current generator (212), an output of the second operational amplifier (302) being connected to a gate of the first transistor (311), an output (26) of the controllable current generator (212) being designed for connecting to the first terminal (1), and to a source of the second transistor (312), the output of the third operational amplifier (303) is connected to the gate of the second transistor (312), a non-inverting input of the third operational amplifier (303) being connected to a common node of the first transistor (311) and the second resistor $R_{cg2}$ connected in series, an inverting input of the third operational amplifier (303) being connected to a common node of a drain of the second transistor (312) and the third resistor $R_{cg3}$ connected in series, the second $R_{cg2}$ and third $R_{cg3}$ resistors being connected to terminal (22) of the controllable current generator (212) being designed to power the controllable current generator, the output of the first operational amplifier (208) being connected to the third terminal (3), a first terminal of the reference resistor $R_{ref}$ being connected to the non-inverting input of the first operational amplifier (208), a second terminal of the reference resistor $R_{ref}$ being connected to the fifth terminal (5), a first terminal of the bias resistor $R_{bias}$ being connected to the sixth terminal (6), a second terminal of the bias resistor $R_{bias}$ being connected to the non-inverting input of the first operational amplifier (208), and the fourth terminal (4) and the fifth terminal (5) being connected with each other and with a terminal (28) of the controllable current generator (212) inside the IC, a first input of the adder (206) being connected to the first terminal (1) of said controller (220), a second input of the adder (206) being connected to the second terminal (2) of said controller (220), an output of the adder (206) beings connected to an inverting input of the first operational amplifier (208).

7. An integrated circuit (IC) for a controller (220) for an ECR (222), the IC comprising:

a first terminal (1) designed for connecting to a first terminal of an external variable control resistor $R_c$, a second terminal (2) designed for receiving a feedback signal from a common node of an external sense resistor $R_{sense}$ and an external active element (224), a third terminal (3) designed for connecting to a control terminal of the external active element (224), a fourth terminal (4) designed for connecting to a second terminal of the external variable control resistor $R_c$, a fifth terminal (5) designed for connecting to a low-potential terminal (12) of the ECR (222), a sixth terminal (6) designed for connecting to a high-potential terminal (10) of the ECR (222), a first operational amplifier (208), an adder (206), and a controllable current generator (212), the controllable current generator (212) comprising a second operational amplifier (302), a third operational amplifier (303), a first transistor (311), a second transistor (312), a first resistor $R_{cg1}$, a second resistor $R_{cg2}$, and a third resistor $R_{cg3}$, a control input (24) of the controllable current generator (212) being designed for connecting to the second (2) terminal and to a non-inverting input of the second operational amplifier (302), an inverting input of the second operational amplifier (302) being connected to a common node of a source of the first transistor (311) and a first terminal of the first resistor $R_{cg1}$ connected in series, a second terminal of the first resistor $R_{cg1}$ being connected to a terminal (28) of the controllable current generator (212), an output of the second operational amplifier (302) being connected to a gate of the first transistor (311), an output (26) of the controllable current generator (212) being designed for connecting to the first terminal (1) and being connected to a source of the second transistor (312), the output of the third operational amplifier (303) being connected to a gate of the second transistor (312), a non-inverting input of said third operational amplifier (303) being connected to a common node of a drain of the first transistor (311) and the second resistor $R_{cg2}$ connected in series, an inverting input of the third operational amplifier (303) being connected to a common node of a drain of the second transistor (312) and the third resistor $R_{cg3}$ connected in series, the second $R_{cg2}$ and third $R_{cg3}$ resistors being connected to terminal (22) of the controllable current generator (212) being designed to power the controllable current generator (212), a non-inverting input of the first operational amplifier (208) being designed for connecting to a midpoint of an external voltage divider comprising a bias resistor $R_{bias}$ and a reference resistor $R_{ref}$ connected in series between a high-potential terminal and a low-potential terminal, the output of the first operational amplifier (208) being connected to the third terminal (3), and the fourth terminal (4) and the fifth terminal (5) of said IC being connected with each other and with a terminal (28) of the controllable current generator (212) inside the IC, a first input of the adder (206) being connected to the first terminal (1) of said controller (220), a second input of the adder (206) being connected to the second terminal (2) of said controller (220), an output of the adder (206) beings connected to an inverting input of the first operational amplifier (208).

* * * * *